(12) United States Patent
Shibata

(10) Patent No.: US 6,461,890 B1
(45) Date of Patent: Oct. 8, 2002

(54) STRUCTURE OF SEMICONDUCTOR CHIP SUITABLE FOR CHIP-ON-BOARD SYSTEM AND METHODS OF FABRICATING AND MOUNTING THE SAME

(75) Inventor: Kazutaka Shibata, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/383,640

(22) Filed: Aug. 26, 1999

Related U.S. Application Data

(62) Division of application No. 08/997,801, filed on Dec. 24, 1997, now abandoned.

(30) Foreign Application Priority Data

| Dec. 27, 1996 | (JP) | ................................. 8-349669 |
| Jan. 24, 1997 | (JP) | ................................. 9-011560 |
| Jan. 24, 1997 | (JP) | ................................. 9-011561 |

(51) Int. Cl.$^7$ ................................. H01L 21/50
(52) U.S. Cl. ................ 438/106; 438/118; 438/119; 438/120
(58) Field of Search ................ 438/106, 118, 438/119, 120; 257/783, 780, 728, 777, 690, 737, 738

(56) References Cited

U.S. PATENT DOCUMENTS

| 4,811,081 | A |   | 3/1989 | Lyden |
| 5,001,542 | A |   | 3/1991 | Tsukagoshi et al. |
| 5,118,370 | A | * | 6/1992 | Ozawa ................... 156/73.1 |
| 5,136,365 | A |   | 8/1992 | Pennisi et al. |
| 5,489,551 | A | * | 2/1996 | Castlberry ................ 437/173 |
| 5,804,882 | A |   | 9/1998 | Tsukagoshi et al. |
| 5,861,661 | A |   | 1/1999 | Tang et al. |
| 5,945,834 | A | * | 8/1999 | Nakata et al. ............. 324/754 |

FOREIGN PATENT DOCUMENTS

JP  411040522 A  *  2/1999  ......... H01L/21/301

* cited by examiner

Primary Examiner—Caridad Everhart
Assistant Examiner—V. Yevsikov
(74) Attorney, Agent, or Firm—Arent Fox Kintner Plotkin & Kahn

(57) ABSTRACT

A structure and a method which can reliably electrically connect opposed terminals with each other are disclosed. First and second terminals are opposed to each other, so that an anisotropic conductive film is interposed therebetween. Ultrasonic vibration is supplied between the terminals while applying pressure so that the first and second terminals approach to each other. The first and second terminals are electrically connected with each other through conductive grains contained in the anisotropic conductive film. The conductive grains and the terminals are alloy-bonded with each other.

8 Claims, 15 Drawing Sheets

STRUCTURE OF SEMICONDUCTOR CHIP SUITABLE FOR CHIP-ON-BOARD SYSTEM AND METHODS OF FABRICATING AND MOUNTING THE SAME

This is a divisional application of Ser. No. 08/997,801 filed Dec. 24, 1997, abandoned.

BACKGROUND OF THE INVENTION

1. Field of the Invention

The present invention relates to a semiconductor chip, and more particularly, it relates to the structure of a semiconductor chip suitable for a chip-on-board system and methods of fabricating and mounting the same.

For example, a semiconductor chip such as an IC chip provided with a plurality of terminals on its major surface is mounted on a printed wiring board or a lead frame in the so-called chip-on-board system. In order to cope with the chip-on-board mount system, an anisotropic conductive film, for example, is stuck on the major surface of the semiconductor chip.

2. Description of the Prior Art

FIG. 1 illustrates a semiconductor chip 10 which is mounted on a circuit board 20 in the chip-on-board system. A plurality of first bumps 11 for connection are protrusively formed on a major surface of the semiconductor chip 10. On the other hand, a plurality of second bumps 21 are protrusively formed on a surface of the circuit board 20, to be opposed to the first bumps 11 of the semiconductor chip 10 respectively. The chip-on-board system is adapted to oppose the major surface of the semiconductor chip 10 to the circuit board 20 through an anisotropic conductive film 30 and bring these members into pressure contact with each other under heat, thereby electrically connecting and bonding the opposed first and second bumps 11 and 21 with each other while keeping insulation in the remaining regions. Throughout the specification, the term "bump" must be understood as indicating an electrode, a terminal pad or a conductor pad formed in a slightly protruding manner.

The anisotropic conductive film 30 includes an adhesive resin film 31 and conductive grains 32 dispersed in this resin film 31. The conductive grains 32 are prepared from metal balls, for example. The metal balls may be replaced with resin balls having nickel-plated surfaces or those further having gold plating on such nickel-plated surfaces, for example.

When prescribed pressure is so applied under heat that the semiconductor chip 10 and the circuit board 20 approach to each other through the anisotropic conductive film 30 interposed therebetween, portions of the anisotropic conductive film 30 located between the first bumps 11 of the semiconductor chip 10 and the second bumps 21 of the circuit board 20 are softened and crushed. Consequently, the first and second bumps 11 and 21 are electrically connected with each other through the conductive grains 32.

In the remaining uncrushed regions of the anisotropic conductive film 30 not located between the first and second bumps 11 and 21, the conductive grains 32 are still dispersed. Thus, these regions keep insulation. Further, the semiconductor chip 10 and the circuit board 20 are bonded with each other due to the adhesive strength of the anisotropic conductive film 30.

In the aforementioned mount method, electrical conduction can be attained only in necessary portions, and the semiconductor chip 10 can be mounted on the circuit board 20 by simply applying pressure so that the semiconductor chip 10 and the circuit board 20 approach to each other through the anisotropic conductive film 30 interposed therebetween. This method is remarkably simple as compared with a method of mounting the semiconductor chip 10 on the circuit board 20 or the like by the so-called chip bonding and wire bonding.

However, the method of connecting the bumps 11 and 21 through the anisotropic conductive film 30 shown in FIG. 1 is merely adapted to press the semiconductor chip 10 and the circuit board 20 through the anisotropic conductive film 30 interposed therebetween with application of heat. Therefore, this method is insufficient. in stability of electrical connection. Namely, the conductive grains 32 contained in the anisotropic conductive film 30 may not properly come into contact with the bumps 11 and 21 unless the heating temperature and the pressure-contact force are properly managed. When the semiconductor chip 10 is to be mounted on a printed circuit board based on glass epoxy resin or the like, the board may be distorted or warped, leading to loose connection between the bumps 11 and 21.

In the conventional mount method shown in FIG. 1, the anisotropic conductive film 30 having a size corresponding to that of the semiconductor chip 10 is previously prepared, to be interposed between the semiconductor chip 10 and the circuit board 20. The prepared anisotropic conductive film 30 is first placed on a prescribed position of the circuit board 20, so that the semiconductor chip 10 is placed on this anisotropic conductive film 30. Alternatively, the anisotropic conductive film 30 formed in a prescribed size is previously stuck on the major surface of the semiconductor chip 10, so that the semiconductor chip 10 having the anisotropic conductive film 30 is placed on a prescribed position of the circuit board 20.

In either case, a single anisotropic conductive film 30 must be prepared for a single semiconductor chip 10, in order to mount the semiconductor chip 10 on the circuit board 20 in the chip-on-board system. Therefore, the anisotropic conductive film 30 must be prepared in the size corresponding to that of the semiconductor chip 10, and such anisotropic conductive films 30 must be prepared in a number responsive to that of semiconductor chips 10 to be mounted, leading to reduction of workability and increase in cost. Further, the anisotropic conductive films 30 formed in the prescribed size must be placed one by one on the circuit boards 20 or stuck one by one to the surfaces of the semiconductor chips 10. Thus, the number of working steps is increased and the workability is deteriorated.

In general, each semiconductor chip 10 is packaged with resin, to be prevented from penetration of moisture or air from the exterior. If an unpackaged semiconductor chip 10 is mounted on the circuit board 20 or the like in the chip-on-board system, an electronic circuit formed on the semiconductor chip. 10 cannot be completely blocked and shielded against the exterior in the mounted state. Therefore, moisture or air disadvantageously penetrates into the electronic circuit of the semiconductor chip 10, to inhibit the semiconductor chip 10 from exhibiting its original characteristics.

SUMMARY OF THE INVENTION

An object of the present invention is to further ensure electrical connection between butted terminals.

Another object of the present invention is to improve workability in case of mounting a semiconductor chip on a circuit board or the like in the chip-on-board system.

Still another object of the present invention is to effectively prevent penetration of moisture or air from the exterior in a semiconductor chip having an anisotropic conductive film stuck on its major surface.

A connection structure between terminals according to an aspect of the present invention comprises a first member having a first terminal on its surface, a second member having a second terminal opposed to the first terminal on its surface, and an anisotropic conductive film arranged between the first and second members. The anisotropic conductive film includes an adhesive resin film and conductive grains dispersed in this resin film. The first and second terminals are electrically connected with each other through the conductive grains. The. conductive grains are alloy-bonded with at least either one of the first and second terminals. Typically, the first member is a semiconductor chip, and the second member is a circuit board or a lead frame.

No alloy bonding is attained by merely heating/pressing the anisotropic conductive film. Namely, the alloy bonding can be implemented by properly selecting metals forming the terminals and the conductive grains contained in the anisotropic conductive film and supplying ultrasonic vibration between the terminals to be electrically connected with each other. The alloy bonding highly attains stability of the electrical connection between the first and second terminals.

A method of connecting terminals according to another aspect of the present invention comprises steps of arranging a first terminal formed on a surface of a first member and a second terminal formed on a surface of a second member to be opposed to each other, interposing a film between the opposed first and second members, and supplying ultrasonic vibration between the first and second terminals while applying pressure so that the first and second members approach to each other thereby electrically connecting the first and second terminals with each other. In an embodiment, the film is an anisotropic conductive film prepared by dispersing conductive grains in an adhesive resin film. In another embodiment, the film is a thermo-adhesive resin film. Typically, the first member is a semiconductor chip, and the second member is a circuit board or a lead frame.

The anisotropic conductive film is basically identical to a conventional one employed in the chip-on-board system. Namely, the conductive film has a structure dispersing conductive grains in an adhesive resin film. The conductive grains, which are dispersed in the resin film, are isolated from each other by insulating resin in a general state. In this case, therefore, both surfaces of the anisotropic conductive film are insulated from each other. When pressure is applied to a prescribed region of the anisotropic conductive film along its thickness preferably under heat to crush the film, on the other hand, surfaces of the conductive grains are exposed on both surfaces of the film which is crushed and reduced in thickness. Therefore, the surfaces opposed to each other through the grains electrically conduct with each other.

According to the present invention, not only the anisotropic conductive film interposed between the first and second terminals is pressed but ultrasonic vibration is applied between the terminals for electrically connecting the same with each other. Preferably, the-first and second terminals and the anisotropic conductive film interposed therebetween are heated. When ultrasonic vibration is supplied between the first and second terminals the conductive grains contained in the anisotropic conductive film crushed therebetween are reliably electrically connected with the terminals by vibrational friction. In addition, the metals forming the terminals and the conductive grains are so properly selected as to form a eutectic alloy on contact portions thereof. Formation of such a eutectic alloy leads to further reliable electrical connection between the terminals and the conductive grains.

The surfaces provided with the first and second terminals respectively are fixed to each other due to bonding through the anisotropic conductive film. Consequently, stability of the electrical connection between the terminals is improved according to the inventive method of connecting terminals, as compared with the conventional method employing an anisotropic conductive film. This effect also applies to the case of mounting a semiconductor chip on a board by a chip-on-board mount method or the case of bonding the semiconductor chip on a lead frame. When ultrasonic vibration is supplied under pressure with interposition of the anisotropic conductive film, the terminals are preferably heated. However, it has been confirmed that the temperature is increased by vibrational friction to substantially thermally bond the surfaces provided with the terminals with each other by simply applying pressure and ultrasonic vibration with no heating, by properly selecting the energy.

In case of interposing not an anisotropic conductive film but a thermo-adhesive resin film between the first and second terminals, the resin located between the convexly formed first and second terminals is heated and softened by internal friction caused by ultrasonic vibration between the terminals and quickly flows sidewise to extrude, thereby attaining direct contact between the first and second terminals. The surfaces provided with the first and second terminals respectively are bonded and fixed to each other by the adhesive strength of the resin.

According to the aforementioned method, the surfaces provided with the opposed terminals can be readily connected with each other while attaining electrical conduction of the opposed terminals and insulating the remaining regions from each other by simply performing the aforementioned operation with interposition of an insulating resin sheet of epoxy resin, for example, without employing an anisotropic conductive film in particular. This effect also applies to the case of mounting a semiconductor chip on a substrate by a chip-on-board mount method or the case of bonding the semiconductor chip on a lead frame. While the terminals are preferably heated when pressure and ultrasonic vibration are applied therebetween as hereinabove described, heat may not necessarily be supplied from the exterior. Namely, it has been confirmed that the temperature is increased by vibrational friction to substantially thermally bond the surfaces provided with the terminals with each other by simply supplying ultrasonic vibration and properly selecting the energy.

A method of fabricating a semiconductor chip according to still another aspect of the present invention comprises steps of forming a plurality of circuit elements on a major surface of a semiconductor wafer, forming bumps on electrode pads of the circuit elements, forming an anisotropic conductive film covering the overall major surface of the semiconductor wafer, and splitting the semiconductor wafer into each circuit element thereby obtaining a semiconductor chip having an anisotropic conductive film on its surface.

According to the aforementioned fabrication method, the anisotropic conductive film is stuck not on each semiconductor chip but on the wafer not yet split into each semiconductor chip. Thus, the anisotropic conductive film can be simultaneously stuck on all semiconductor chips obtained from a single wafer.

According to the aforementioned method, the anisotropic conductive film may not be prepared in a size corresponding to that of each semiconductor chip, and there is no need to prepare anisotropic conductive films in a number responsive to that of the semiconductor chips for mounting each semiconductor chip on a circuit board or the like. Thus, the workability is improved and the cost can be reduced. Further, the method requires no operation of placing anisotropic conductive films formed in a prescribed size one by one on prescribed positions of circuit boards or the like or no operation of sticking such anisotropic conductive films one by one on surfaces of semiconductor chips, whereby the workability is improved.

Preferably, the step of obtaining the semiconductor chip includes steps of bonding the semiconductor wafer on an expandable tape, forming slits on the anisotropic conductive film and the semiconductor wafer along the boundary lines between the plurality of circuit elements, and splitting the semiconductor wafer into a plurality of semiconductor chips by expanding the expandable tape.

According to the aforementioned preferred method, the semiconductor chips are regularly arranged on the expandable tape at prescribed intervals. Therefore, the semiconductor chips can be directly placed on circuit boards or the like from the state bonded on the expandable tape with the so-called chip mounter or the like, for example. Thus, a series of operations for fabricating the semiconductor chips, sticking the anisotropic conductive film, and placing the semiconductor chips on circuit boards or the like can be simplified.

Provided according to a further aspect of the present invention is a method of mounting a semiconductor chip having a bump on its major surface on a support member having a conductor pad to be connected with the bump. This method comprises steps of sticking an anisotropic conductive film on the overall major surface of the semiconductor chip, placing the semiconductor chip on the support member so that the bump and the conductor pad are opposed to each other through the anisotropic conductive film, and electrically connecting the bump and the conductor pad with each other by applying pressure so that the semiconductor chip and the support member approach to each other under heat. Preferably, ultrasonic vibration is supplied between the semiconductor chip and the support member when applying the pressure. The support member is typically a circuit board or a lead frame.

A semiconductor chip structure according to a further aspect of the present invention comprises a semiconductor chip having a bump for electrical connection on its major surface, and an anisotropic conductive film which is stuck on the semiconductor chip to cover the overall major surface of the semiconductor chip and has an outer peripheral edge protruding outward beyond that of the semiconductor chip.

When the aforementioned semiconductor chip is pressed in a heated state to be mounted on a circuit board or the like, a resin film of the anisotropic conductive film is so softened that the semiconductor chip engages into the softened resin film. In other words, the side surface of the semiconductor chip is covered with the resin film of the anisotropic conductive film, whereby an electronic circuit of the semiconductor chip is completely blocked and shielded against the exterior. In particular, the anisotropic conductive film is stuck on the semiconductor chip to protrude beyond the peripheral edge thereof in the aforementioned semiconductor chip structure, whereby the side surface of the semiconductor chip is further reliably covered with the resin film of the anisotropic conductive film.

When the side surface of the semiconductor chip is covered with the resin film of the anisotropic conductive film, an effect similar to that in case of packaging the semiconductor chip with resin is attained. Namely, the electronic circuit of the semiconductor chip can be prevented from penetration of moisture or air through the resin film of the anisotropic conductive film with no resin packaging, and the semiconductor chip can sufficiently exhibit its original characteristics utilized.

According to a preferred embodiment, the semiconductor chip structure further comprises a protective film covering a corner part between the side surface of the semiconductor chip and the rear surface of the protruding part of the anisotropic conductive film. The protective film is formed along the side surface of the semiconductor chip. When the semiconductor chip is mounted on a circuit board or the like, therefore, the electronic circuit is blocked and shielded against the exterior by the protective film, in addition to the softened resin film of the anisotropic conductive film. Thus, the aforementioned effect can be further prompted.

In a method of mounting a semiconductor chip according to a further aspect of the present invention, an anisotropic conductive film is first stuck on the overall major surface of a semiconductor chip. The outer peripheral edge of the anisotropic conductive film protrudes outward beyond that of the semiconductor chip. Then, the semiconductor chip is placed on a support member so that a bump of the semiconductor chip and a conductor pad of the support member are opposed to each other through the anisotropic conductive film. Thereafter pressure is applied under heat so that the semiconductor chip and the support member approach to each other, for electrically connecting the bump and the conductor pad with each other.

When pressure is applied to the anisotropic conductive film along its thickness in a heated state to crush the same in the aforementioned mount method, a resin film of the softened anisotropic conductive film extends along the side surface of the semiconductor chip. When the resin film is hardened and the semiconductor chip is mounted, an electronic circuit of the semiconductor chip is blocked and protected against the exterior by the resin film. When the semiconductor chip provided with a protective film along its side surface is mounted on a circuit board or the like, the electronic circuit of the semiconductor chip can be further reliably protected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
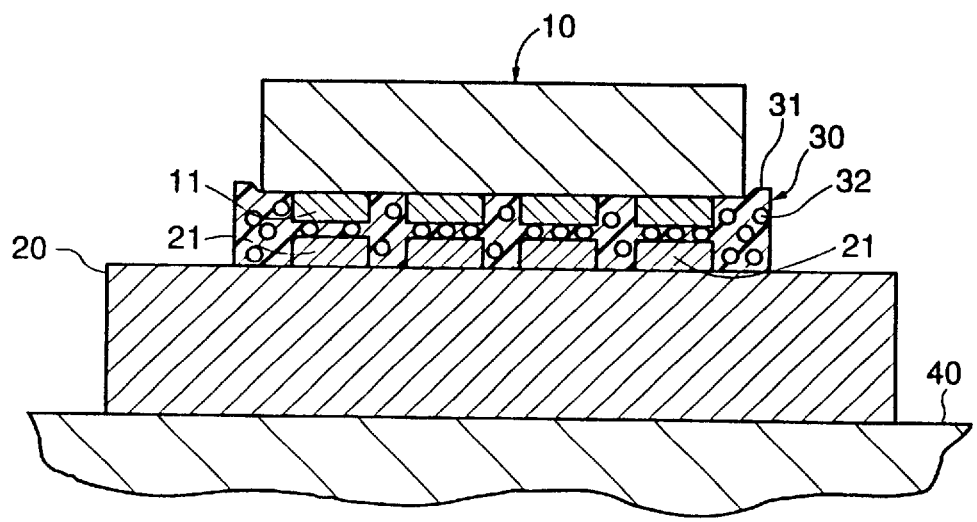
FIG. 1 is a typical sectional view showing a conventional mount structure for a semiconductor chip.

An embodiment of the present invention is now described with reference to FIGS. 2 to 4. Elements or parts equivalent to those shown in FIG. 1 are denoted by the same reference numerals.

A plurality of first terminals 11 are formed on a major surface (active surface) of a semiconductor chip 10 such as an IC chip. The terminals 11 are in the form of bumps obtained by plating aluminum pads with gold, for example. Regions of the major surface of the semiconductor chip 10 provided with no first terminals 11 are covered with a passivation film.

A plurality of second terminals 21 are formed on a printed wiring board 20 for carrying the semiconductor chip 10 thereon, to be opposed to the first terminals 11 respectively. The printed wiring board 20 is obtained by forming a copper film on a surface of a base material of glass epoxy resin, for example. Prescribed etching is performed on the copper film, for forming wiring patterns. The second terminals 21 are obtained by plating the wiring patterns with nickel and gold. Exposed regions of the substrate 20 provided with no second terminals 21 are generally covered with an insulating resin film called a green resist film. The second terminals 21, which are plated with nickel and gold, slightly protrude from the surface of the board 20.

Figure 2:
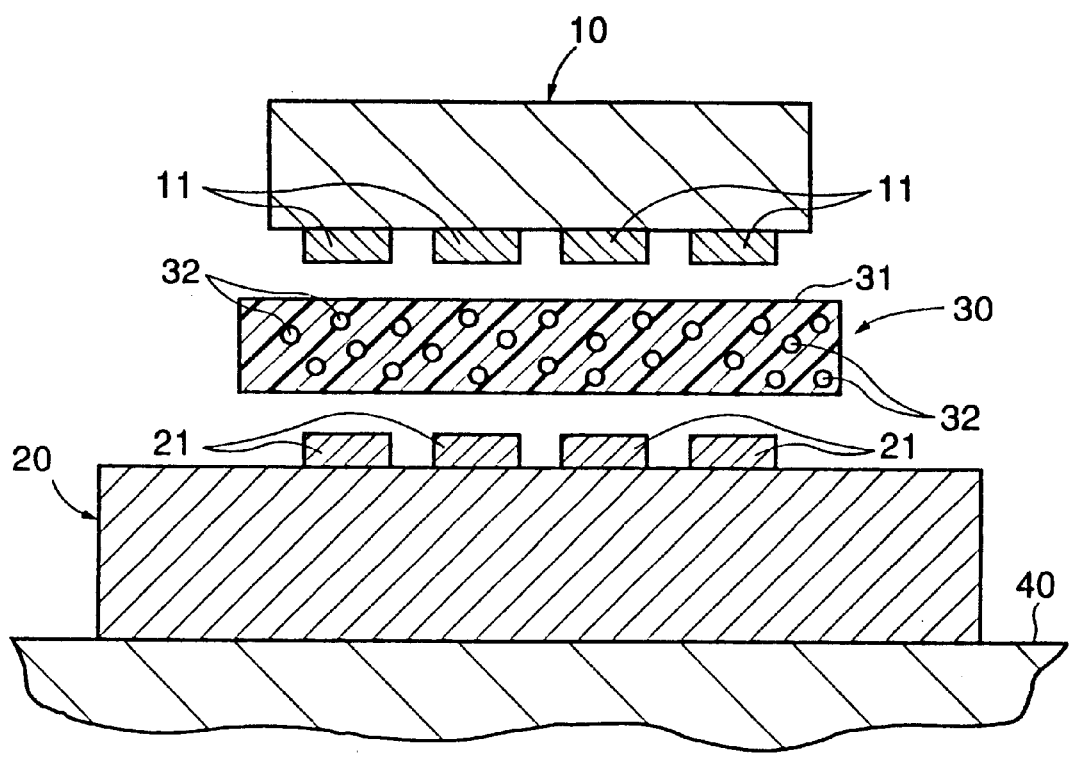
FIG. 2 illustrates a step of a mount method according to the present invention.

As shown in FIG. 2, the first terminals 11 of the semiconductor chip 10 and the second terminals 21 of the printed wiring board 20 are opposed to each other, so that an anisotropic conductive film 30 is held therebetween. As shown in FIG. 3, the semiconductor chip 10 and the printed wiring board 20 are pressed with prescribed pressure to approach to each other. At this time, a support 40 carrying the printed wiring board 20 thereon is heated to about 180° C., for example, by a heater (not shown) provided therein.

Figure 3:
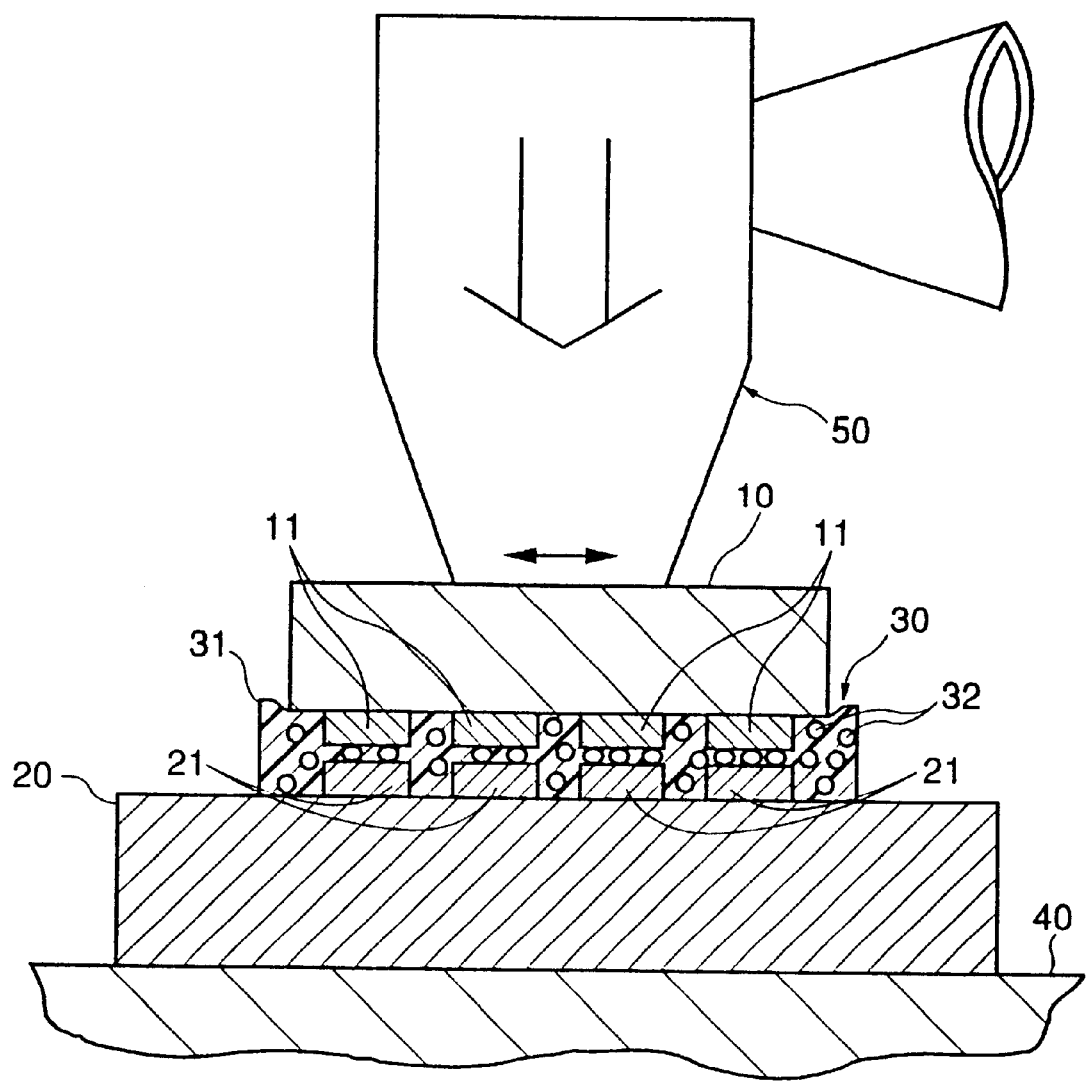
FIG. 3 illustrates another step of the mount method according to the present invention.

As shown in FIG. 3, the semiconductor chip 10 is pressed against the board 20 with an ultrasonic horn 50. Thus, the semiconductor chip 10 is not only thermocompression-bonded to the substrate 20 but also supplied with ultrasonic vibration.

The anisotropic conductive film 30 includes an epoxy resin film 31, for example, and conductive grains 32 dispersed in the resin film 31. The conductive grains 32 may be prepared from metal grains, or resin grains having gold-plated surfaces. The anisotropic conductive film 30 is 30 to 50 $\mu$m in thickness, for example, in an unpressed state, and the conductive grains 32 are 5 $\mu$m in grain diameter, for example.

When selected regions of the anisotropic conductive film 30 are heated and pressed along its thickness, the resin component is softened and crushed in these regions. Both of the first terminals 11 of the semiconductor chip 10 and the second terminals 21 of the printed wiring board 20 protrude in the embodiment shown in FIG. 3, whereby the regions of the anisotropic conductive film 30 held between the first and second terminals 11 and 21 are selectively crushed, so that the conductive grains 32 dispersed in the resin come into contact with the first and second terminals 11 and 21. In addition, ultrasonic vibration is supplied between the board 20 and the semiconductor chip 10 with prescribed energy, thereby reliably bringing the conductive grains 32 into electrical contact with the first and second terminals 11 and 21. The remaining regions of the anisotropic conductive film 30 not held between the first and second terminals 11 and 21 are not or only slightly crushed, and hence the conductive grains 32 contained in these regions are still dispersed along the thickness of the anisotropic conductive film 30. Thus, the semiconductor chip 10 and the board 20 are kept insulated from each other in the regions provided with no first and second terminals 11 and 21.

In a preferred embodiment, surfaces of the first and second terminals 11 and 21 and the conductive grains 32 are made of gold. In this case, the gold surfaces are recrystallized at the atomic level due to supply of the ultrasonic energy, whereby high electrical conductivity is attained between the contact surfaces.

When the surfaces of the first or second terminals 11 or 21 are made of tin, aluminum or copper, on the other hand, eutectic alloy parts are formed between these surfaces and the gold surfaces of the conductive grains 32. Also in this case, high electrical conduction is attained between the contact surfaces.

Figure 4:
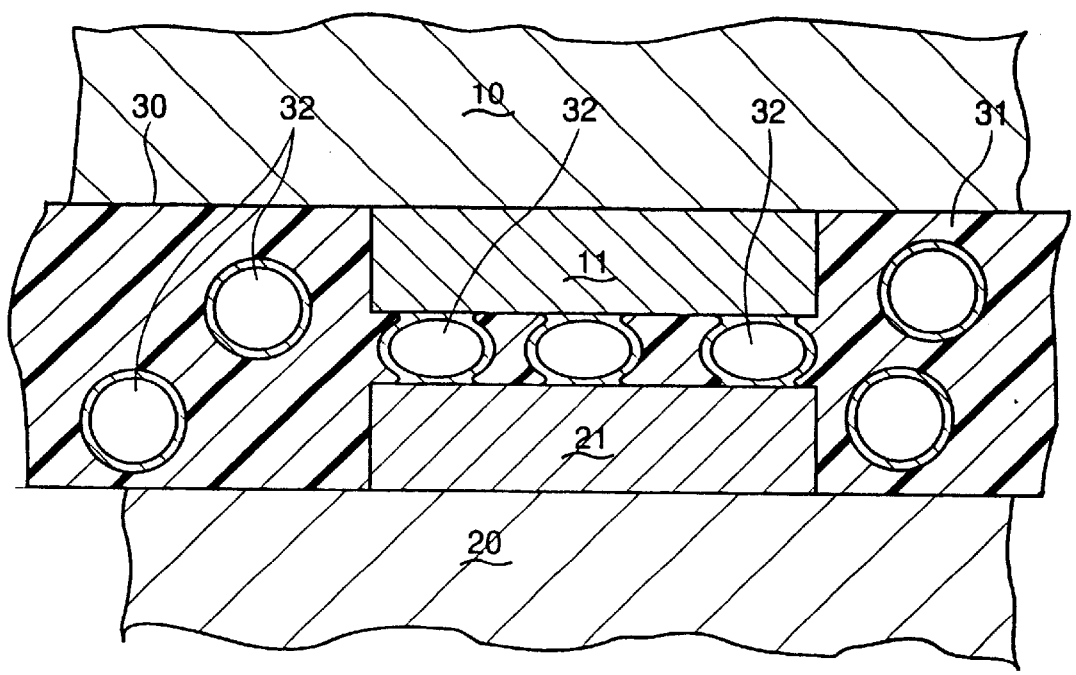
FIG. 4 is a typical sectional view showing first and second terminals electrically connected with each other through conductive grains.
Figure 5:
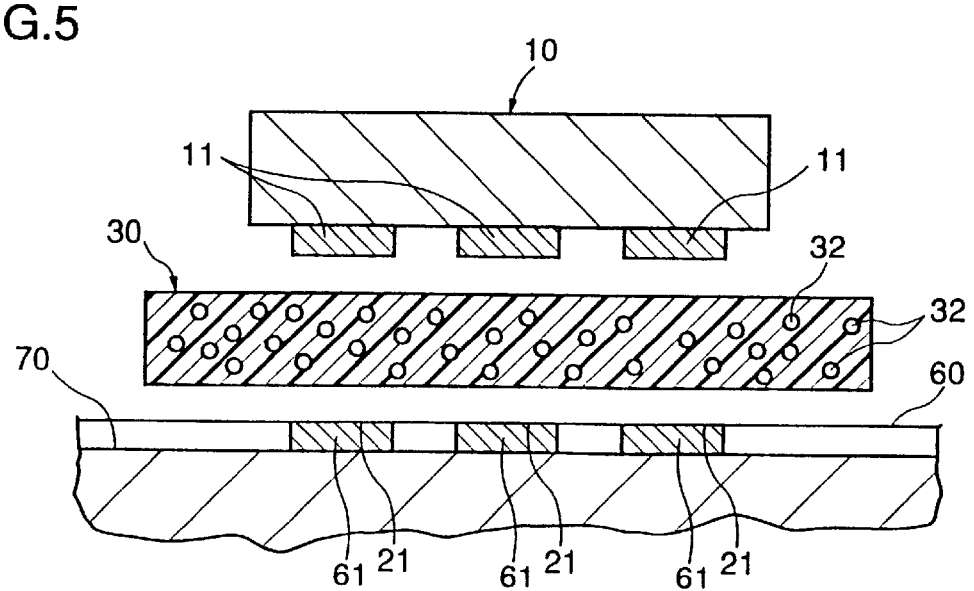
FIG. 5 illustrates a step of mounting a semiconductor chip on a lead frame.
Figure 6:
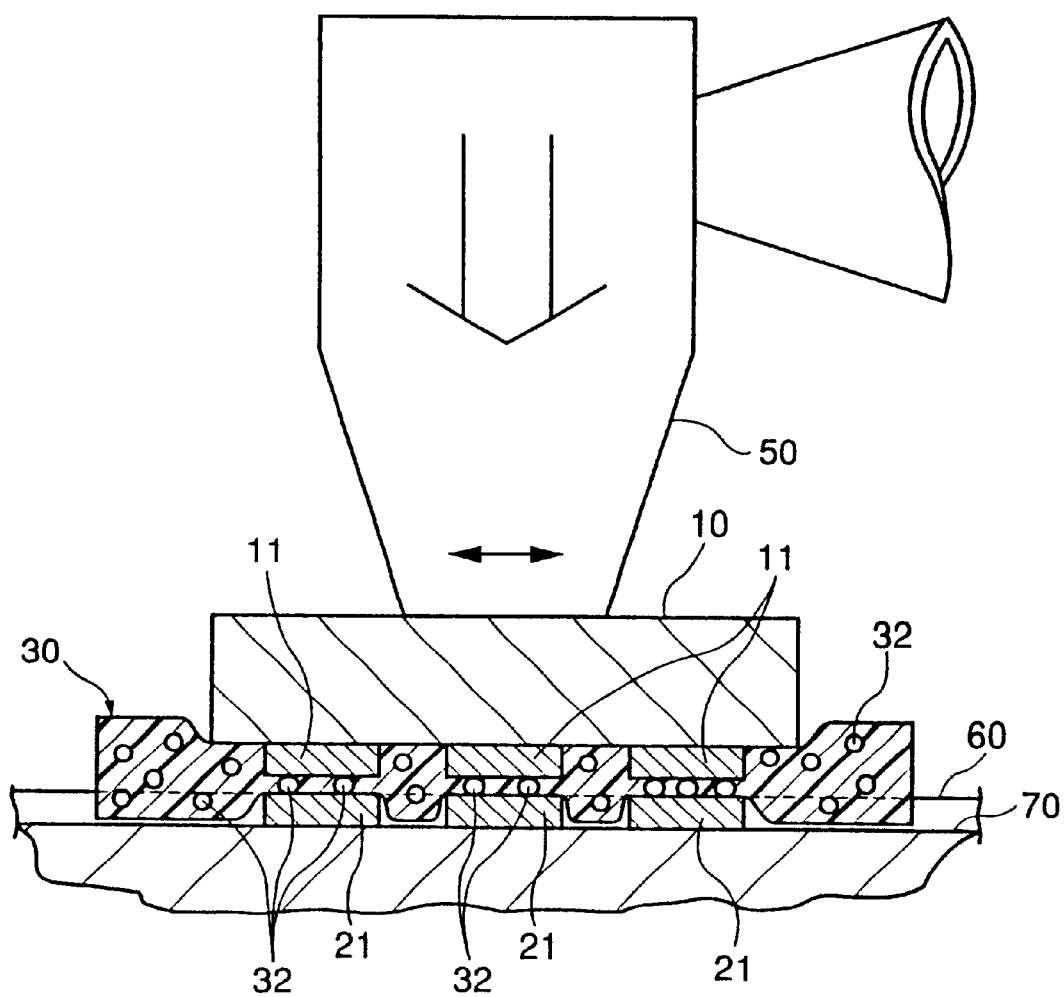
FIG. 6 illustrates another step of mounting the semiconductor chip on the lead frame.

Referring to FIGS. 2 to 4, the semiconductor chip 10 is mounted on the printed wiring board 20. On the other hand, FIGS. 5 and 6 show a semiconductor chip 10 which is bonded onto a lead frame 60. The lead frame 60 is provided with internal lead terminals 61 serving as second terminals 21. Surfaces of the second terminals 21 are preferably plated with gold. First terminals 11 of the semiconductor chip 10 and the second terminals 21 of the lead frame 60 are electrically connected with each other.

The lead frame 60 is supported on a heater block 70, for example. As shown in FIG. 5, an anisotropic conductive film 30 is interposed between the semiconductor chip 10 and the lead frame 60. As shown in FIG. 6, the semiconductor chip 10 is supplied with ultrasonic vibration and pressed against the lead frame 60 with prescribed pressure by an ultrasonic horn 50. Also in this case, the first terminals 11 of the semiconductor chip 10 and the second terminals 21 (the internal lead terminals 61) of the lead frame 60 are reliably electrically connected with each other through conductive grains 32.

Figure 7:
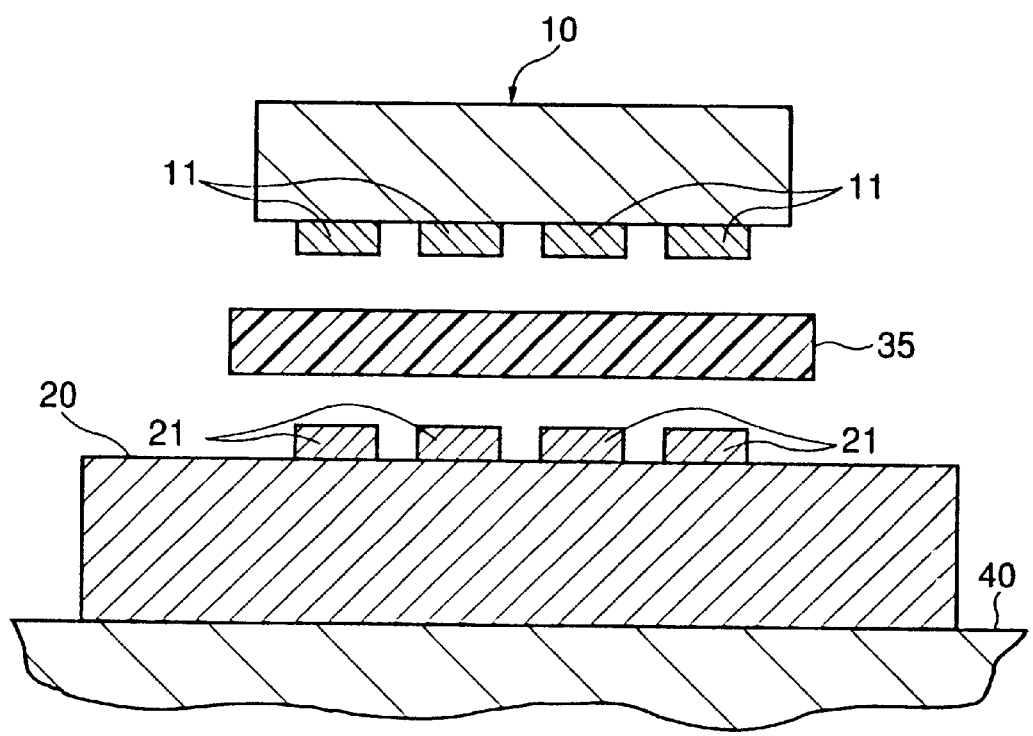
FIG. 7 illustrates a step of a mount method according to another aspect of the present invention.

In each of the two embodiments shown in FIGS. 2 to 6, the opposed first and second terminals 11 and 21 are electrically connected with each other through the conductive grains 32 contained in the anisotropic conductive film 30, while the remaining regions are kept insulated from each other. In an embodiment shown in FIGS. 7 and 8, on the other hand, an epoxy resin film 35 is employed in place of the anisotropic conductive film 30. Namely, the resin film 35 is interposed between first and second terminals 11 and 21, which in turn are brought into pressure contact with each other with supply of ultrasonic waves in a properly heated state. It is recognized that the opposed first and second terminals 11 and 21 are properly electrically connected with each other by this method. Uncrushed parts of the resin film 35 keep insulation between the remaining regions provided with no terminals 11 and 21.

Figure 8:
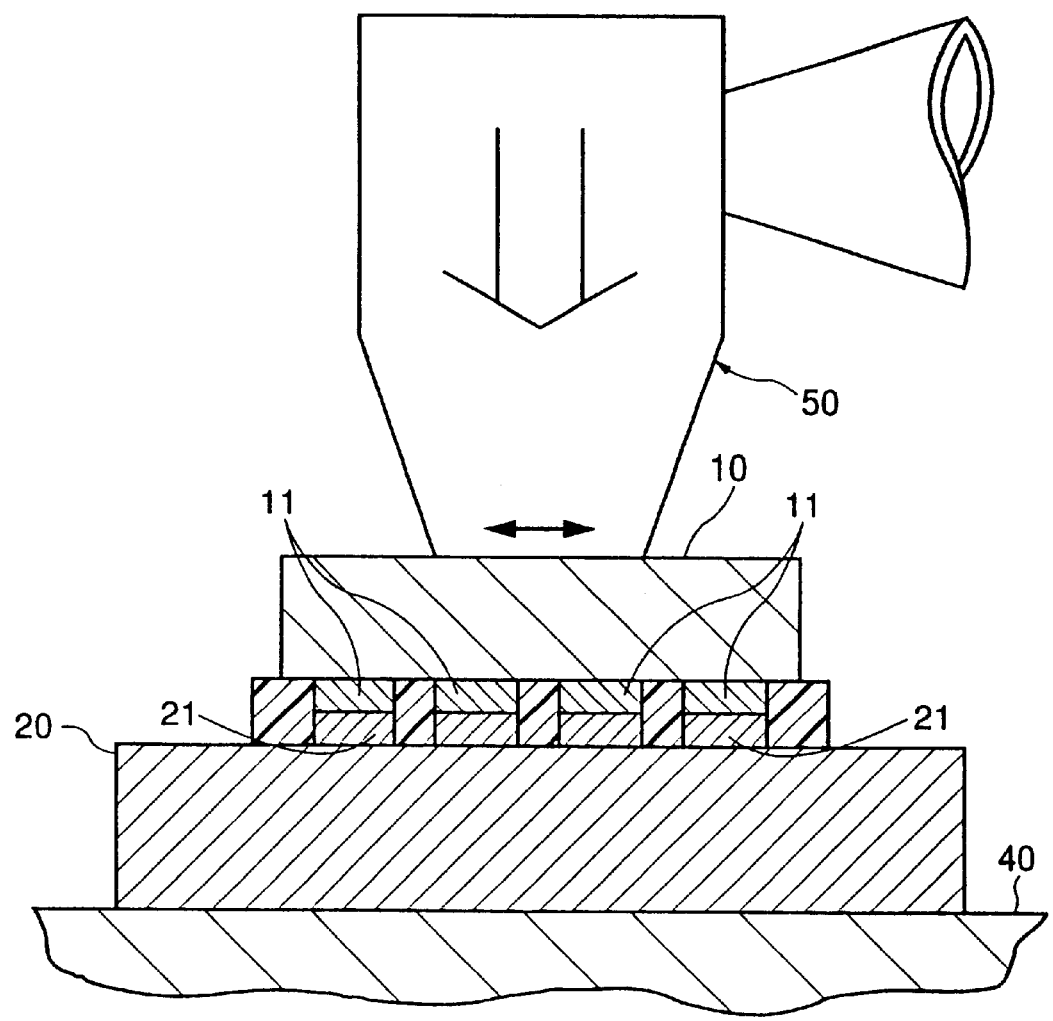
FIG. 8 illustrates another step of the mount method.

When the first and second terminals 11 and 21 are brought into pressure contact with each other under heat and ultrasonic vibration is supplied therebetween as shown in FIG. 8, flowability of the resin film 35 held between the terminals 11 and 21 is improved by frictional heat resulting from the ultrasonic vibration and the terminals 11 and 21 vibrate in sliding directions, to extrude the resin having improved flowability from clearances therebetween. Consequently, the first and second terminals 11 and 21 are brought into direct contact with each other. This method is applicable not only to the case of carrying the semiconductor chip 10 on the printed wiring board 20 but also to the case of bonding the semiconductor chip 10 on the lead frame 60.

While external heating is also employed for bringing the first and second terminals 11 and 21 into pressure contact with each other with ultrasonic vibration in each of the aforementioned embodiments, such external heating may be performed at need.

Figure 9:
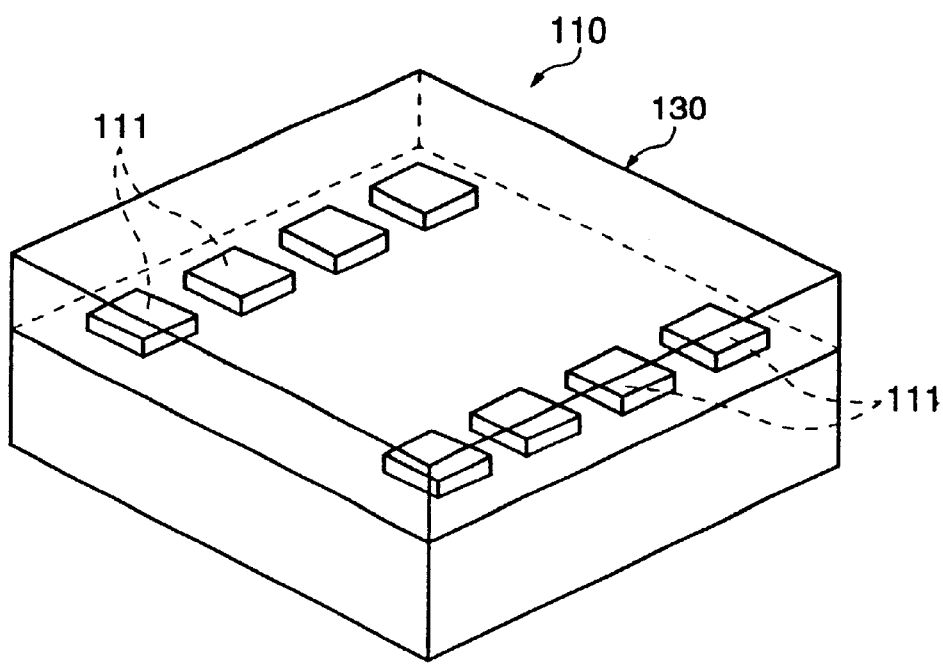
FIG. 9 is a perspective view of a semiconductor chip having an anisotropic conductive film stuck on its major surface.

A semiconductor chip 110 shown in FIG. 9 has first bumps 111 on its major surface. An anisotropic conductive film 130 is stuck on the major surface of the semiconductor chip 110. The semiconductor chip 110 shown in FIG. 9 is fabricated through steps shown in FIGS. 10 to 14.

Figure 10:
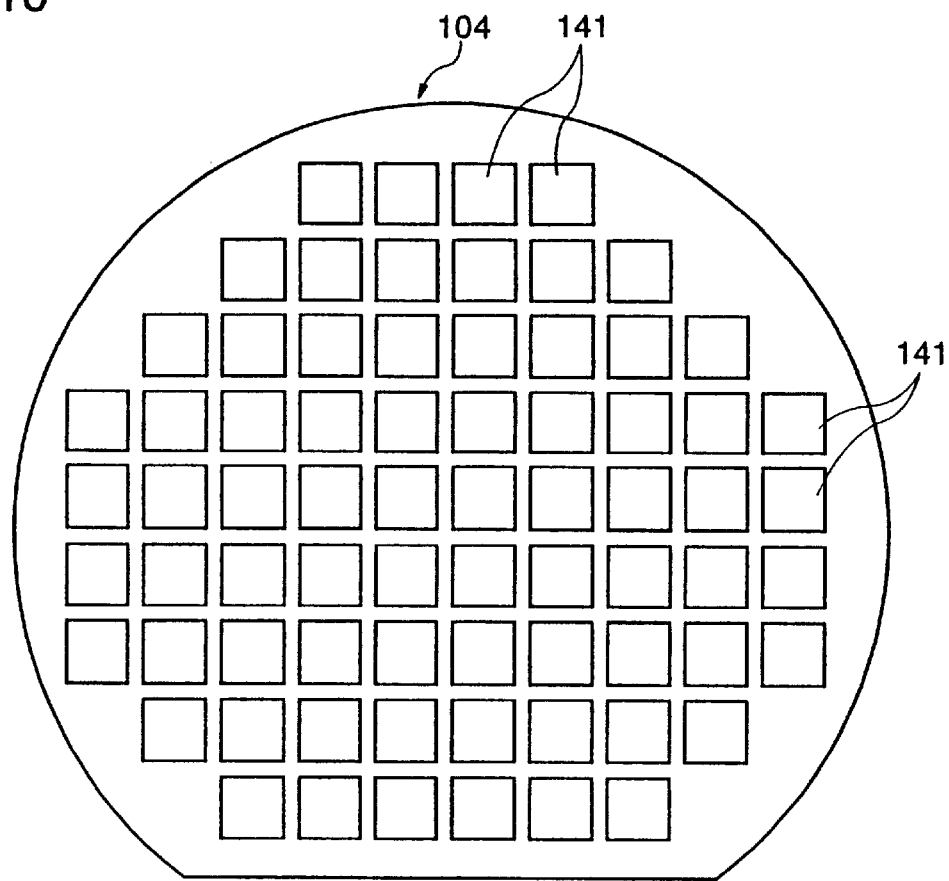
FIG. 10 is a plan view of a semiconductor wafer.

A circuit element 141 is formed on the major surface of the semiconductor chip 110 (see FIG. 10). The first bumps 111 are formed on electrode pads (not shown) of the circuit element 141. The anisotropic conductive film 130 has a structure dispersing conductive grains 132 in an adhesive resin film 131. The conductive grains 132 are prepared from metal balls or resin balls having nickel-plated surfaces, or those further having gold plating on such nickel-plated surfaces. The anisotropic conductive film 130 is 30 to 50 μm in thickness, for example, in an unpressed state, and the conductive grains 132 are 5 μm in grain diameter, for example.

Referring to FIG. 10, a plurality of circuit elements 141 are formed on a surface of a semiconductor wafer 104 consisting of a circular silicon or ceramic substrate. This semiconductor wafer 104 can be readily fabricated by a well-known method.

Figure 11:
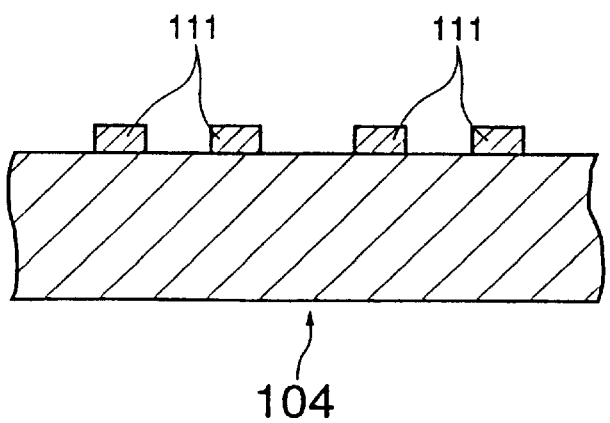
FIG. 11 is a sectional view showing a principal part of the semiconductor wafer.

Referring to FIG. 11, the first bumps 111 are formed on the electrode pads of each circuit element 141. The electrode pads, which are made of aluminum or the like, for example, are plated with gold or the like for forming the first bumps 111. The major surface of the semiconductor chip 110 is covered with a passivation film except the regions provided with the first bumps 111.

Figure 12:
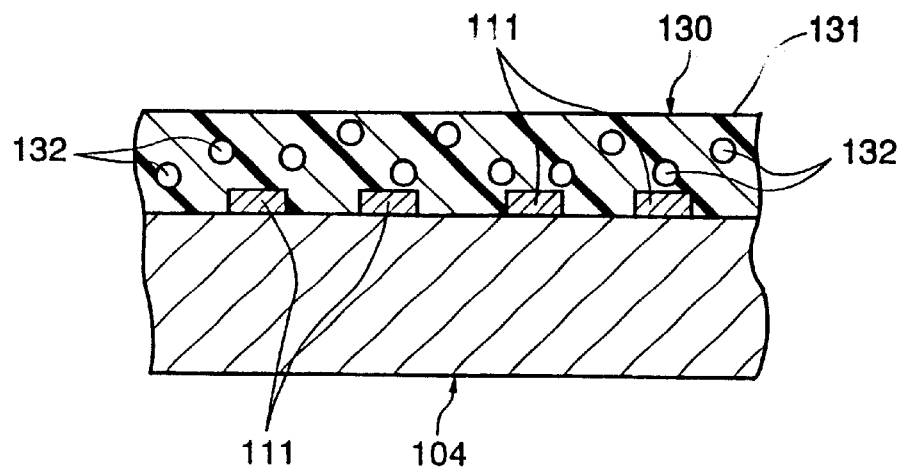
FIG. 12 is a sectional view showing a principal part of the semiconductor wafer on which an anisotropic conductive film is stuck.

Referring to FIG. 12, an anisotropic conductive film 130 having a shape corresponding to that of the semiconductor wafer 104 is stuck on the overall surface of the wafer 104. The anisotropic conductive film 130 has the structure dispersing the conductive grains 132 in the adhesive resin film 131.

Figure 13:
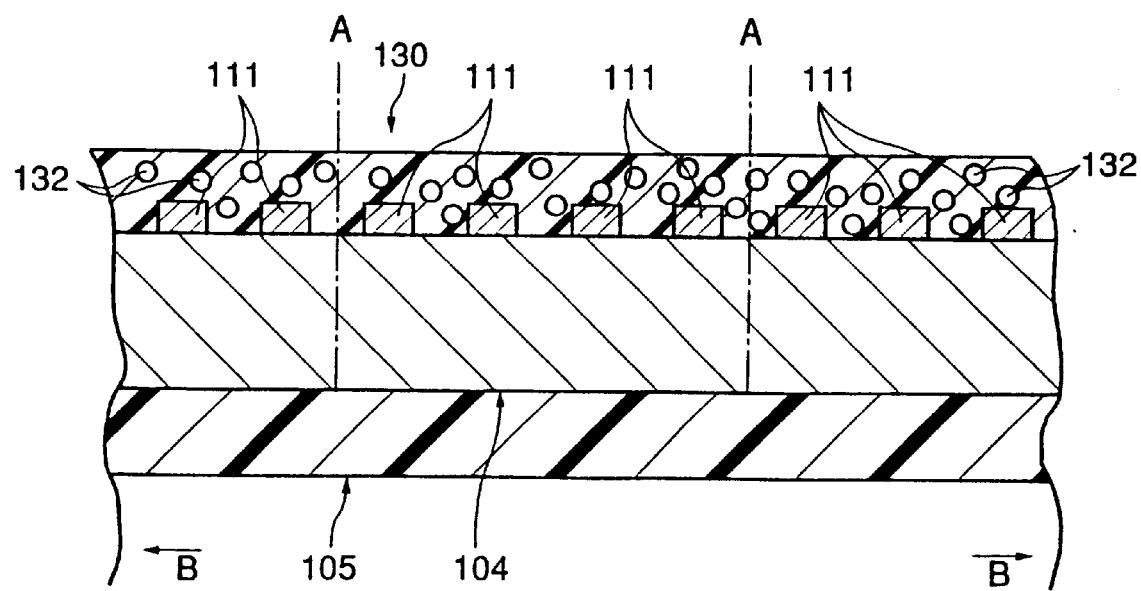
FIG. 13 is a sectional view showing the principal part of the semiconductor wafer placed on an expandable tape.

Referring to FIG. 13, the semiconductor wafer 104 provided with the anisotropic conductive film 130 is placed on an expandable tape 105. The expandable tape 105 is prepared from an adhesive tape having proper elasticity or the like. Then, slits are formed on the wafer 104 and the anisotropic conductive film 130 with a diamond cutter or the like along one-dot chain lines shown by symbol A in FIG. 13. The depth of these slits may be up to a prescribed position of the wafer 104 or a surface of the expandable tape 105.

Figure 14:
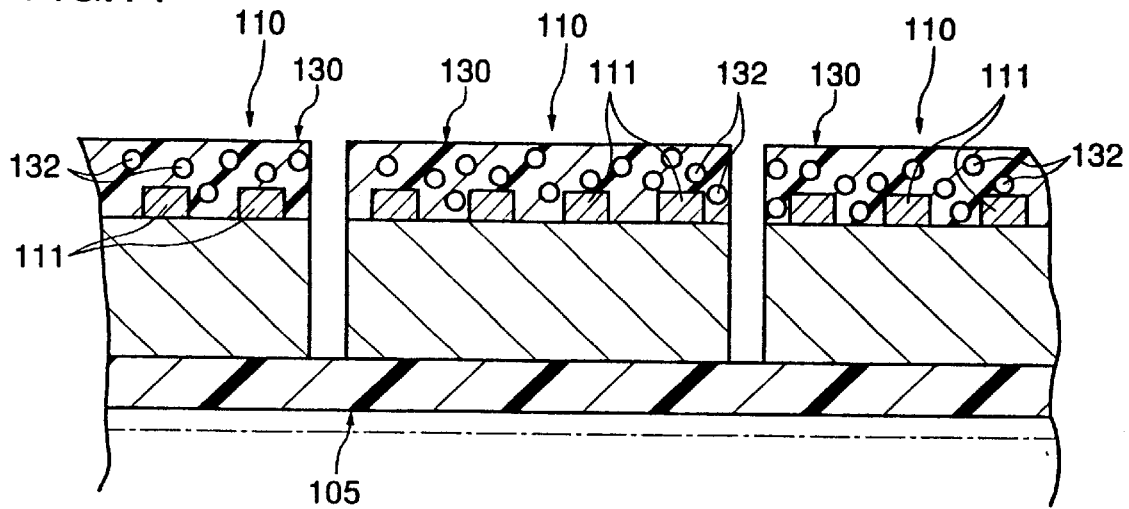
FIG. 14 is a sectional view of the expandable tape expanded in the horizontal direction.

Then, the expandable tape 105 is expanded along arrows B in FIG. 13. Thus, semiconductor chips 110 adjacent to each other are separated at prescribed intervals, as shown in FIG. 14. Thus, a plurality of semiconductor chips 110 each having the anisotropic conductive film 130 shown in FIG. 9 are simultaneously formed.

In the aforementioned method, the anisotropic conductive film 130 is stuck on the overall surface of the wafer 104. Thus, the anisotropic conductive film 130 can be completely stuck on all semiconductor chips 110 obtained from the single semiconductor wafer 104 at the same time. In case of mounting the semiconductor chips 110 on circuit boards or the like, therefore, no anisotropic conductive films having sizes corresponding to those of the semiconductor chips 110 may be previously prepared and no such anisotropic conductive films may be previously prepared in a number corresponding to that of the semiconductor chips 110 to be mounted. Thus, the workability is improved, and the cost can be reduced. Further, this method requires no step of placing anisotropic conductive films formed in prescribed sizes one by one on prescribed positions of circuit boards or the like, or sticking the same on surfaces of the semiconductor chips 110, whereby the workability is improved also in this point.

Figure 15:
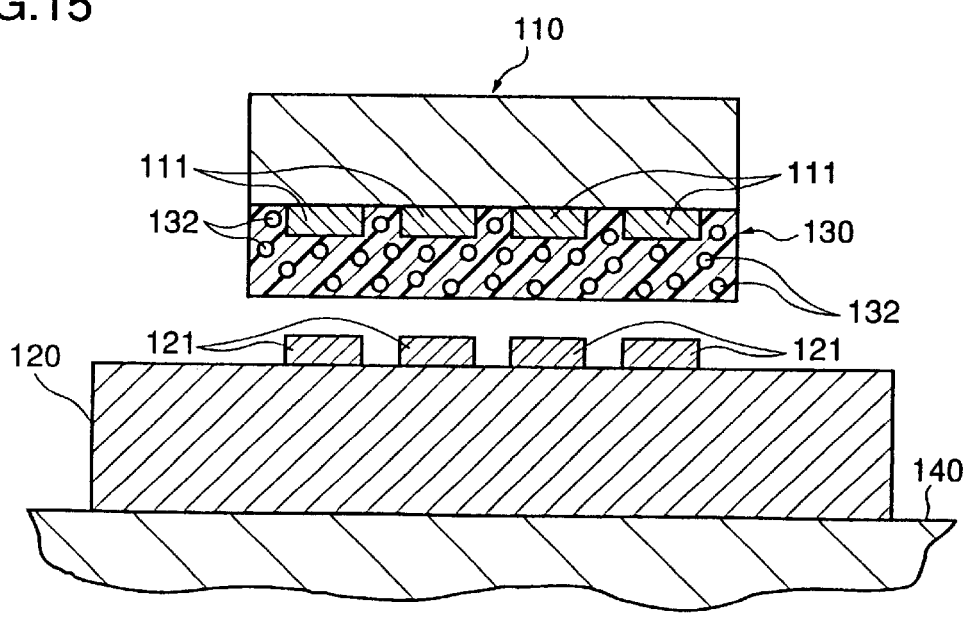
FIG. 15 is a sectional view of a semiconductor chip to be placed on a circuit board.

With reference to FIG. 15, a method of mounting a semiconductor chip 110 provided with an anisotropic conductive film 130 on a circuit board 120 is briefly described. FIG. 15 shows the semiconductor chip 110 having the anisotropic conductive film 130, to be placed on the circuit board 120. The step shown in FIG. 15 is followed by a step identical to that shown in FIG. 3.

As shown in FIG. 15, the semiconductor chip 110 having the anisotropic conductive film 130 is so positioned as to downwardly direct the anisotropic conductive film 130 and oppose its first bumps 111 to second bumps 121 of the circuit board 120, and pressed with prescribed pressure. At this time, a support 140 supporting the circuit board 120 is heated to about 180° C., for example, by a heater (not shown) provided therein.

Similarly to the embodiment shown in FIG. 3, the semiconductor chip 110 is pressed against the circuit board 120 with an ultrasonic horn. Namely, the semiconductor chip 110 is not only thermocompression-bonded to the board 120 but also supplied with ultrasonic vibration.

Similarly to the aforementioned embodiments, regions of the anisotropic conductive film 130 held between the opposed first and second bumps 111 and 121 are selectively crushed, whereby the first and second bumps 111 and 121 are electrically connected with each other through conductive grains 132. Ultrasonic vibration is supplied between the semiconductor chip 110 and the circuit board 120 with prescribed energy, whereby the conductive grains 132 are reliably brought into conductive contact with the first and second bumps 111 and 121 by vibrational friction. The remaining regions of the anisotropic conductive film 130 not held between the first and second bumps 111 and 121 are not or only slightly crushed, whereby the conductive grains 132 contained in these regions are still dispersed along its thickness. Thus, the semiconductor chip 110 and the circuit board 120 are kept insulated from each other in the regions provided with no first and second bumps 111 and 121.

When all surfaces of the first and second bumps 111 and 121 and the conductive grains 132 are made of gold, these gold surfaces are recrystallized at the atomic level due to supply of ultrasonic energy, to attain high electrical conduction therebetween. When the surfaces of the first or second bumps 111 or 121 are made of tin, aluminum or copper, on the other hand, eutectic alloy parts are formed between these surfaces and the gold surfaces of the conductive grains 132. Also in this case, high electrical conduction is attained.

A step of mounting the semiconductor chip 110 fabricated by the aforementioned method on the circuit board 120 can be carried out by directly placing the semiconductor chip 110 on the circuit board 120 from the state formed on the expandable tape 105 by a chip mounter or the like, for example. Namely, a series of operations for fabricating the semiconductor chip 110, sticking the anisotropic conductive film 130 and placing the semiconductor chip 110 on the circuit board 120 can be simplified.

In the aforementioned embodiment, the semiconductor chip 110 is mounted on the circuit board 120. However, the present invention is not restricted to this but the semiconductor chip 110 can also be bonded on a lead frame, for example. In this case, internal lead terminals provided on the lead frame serve similarly to the second bumps 121 of the circuit board 120, and surfaces thereof a preferably plated with gold. The first bumps 111 of the semiconductor chip 110 and the internal lead terminals of the lead frame connected with each other are rendered to electrically conduct with each other, and reliably connected with each other.

Figure 16:
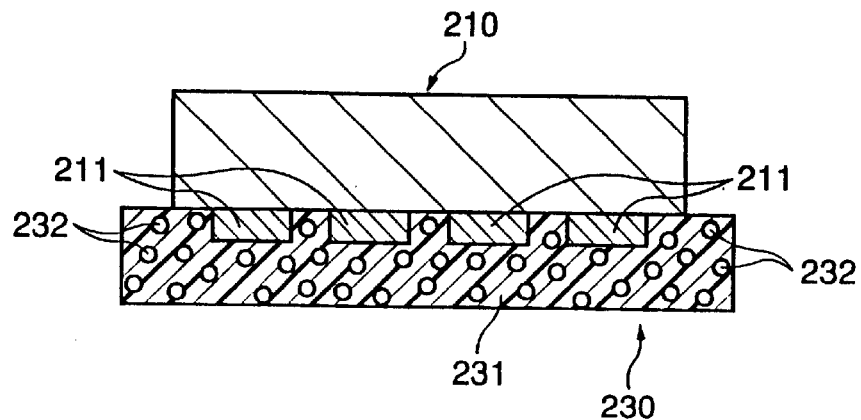
FIG. 16 is a sectional view of a semiconductor chip having a major surface on which an anisotropic conductive film is stuck.

FIG. 16 shows a semiconductor chip structure according to a further embodiment of the present invention. A semiconductor chip 210 is provided on its surface with a prescribed electronic circuit (not shown) and a plurality of protruding electrode pads 211 conducting with the electronic circuit. Further, an anisotropic conductive film 230 is stuck on the surface of the semiconductor chip 210. The semiconductor chip 210 may be fabricated by a well-known method as an IC chip or another element, for example.

The anisotropic conductive film 230 has an area larger than the size of the surface of the semiconductor chip 210. In more concrete terms, the outer peripheral edge of the anisotropic conductive film 230 protrudes outward beyond that of the semiconductor chip 210. The anisotropic conductive film 230 has a structure dispersing conductive grains 232 in an adhesive resin film 231. The conductive grains 232 are prepared from metal or resin balls having nickel-plated surfaces, or those further having gold plating on such nickel-plated surfaces. The anisotropic conductive film 230 is 30 to 50 $\mu$m in thickness, for example, in an unpressed state, and the conductive grains 232 are 5 $\mu$m in grain diameter, for example.

When the semiconductor chip 210 is pressed in a heated state to be mounted on a circuit board 220 or the like, the resin film 231 of the anisotropic conductive film 230 is softened. The semiconductor chip 210 engages into the softened resin film 231. In other words, the side surface of the semiconductor chip 210 is covered with the resin film 231 in the protruding part of the anisotropic conductive film 230, so that the electronic circuit of the semiconductor chip 210 is completely blocked and shielded against the exterior. Particularly in the structure shown in FIG. 16, the anisotropic conductive film 230 is stuck to protrude from the peripheral edge of the semiconductor chip 210, whereby the side surface of the semiconductor chip 210 is reliably covered with the resin film 231 of the anisotropic conductive film 230.

When the side surface of the semiconductor chip 210 is covered with the resin film 231 of the anisotropic conductive film 230, the semiconductor chip 210 attains an effect similar to that resulting from resin packaging. Namely, the electronic circuit of the semiconductor chip 210 can be prevented from penetration of moisture or air through the anisotropic conductive film 230 with no resin packaging, whereby the semiconductor chip 210 can sufficiently exhibit its original characteristics.

Figure 17:
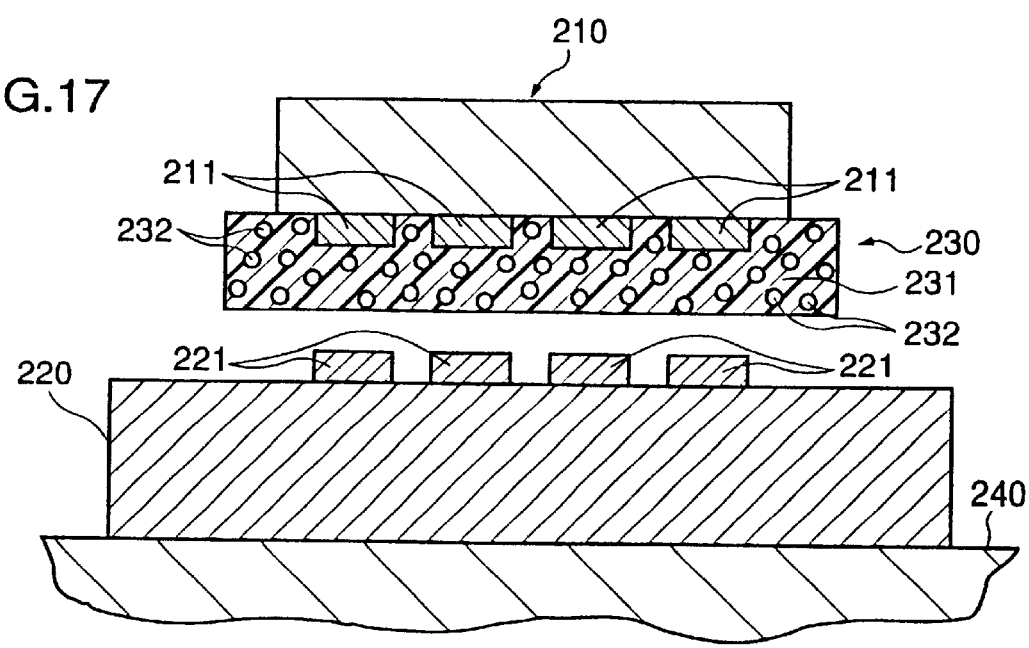
FIG. 17 is a sectional view of the semiconductor chip positioned on a circuit board.

The semiconductor chip 210 having the anisotropic conductive film 230 is mounted on the circuit board 220 as follows: As shown in FIG. 17, the semiconductor chip 210 having the anisotropic conductive film 230 is so positioned as to downwardly direct the anisotropic conductive film 230 and oppose the electrode pads 211 and conductor pads 221 of the circuit board 220 to each other, and pressed under prescribed pressure. At this time, a support 240 supporting the circuit board 220 is heated to about 180° C., for example, by a heater (not shown) provided therein.

Figure 18:
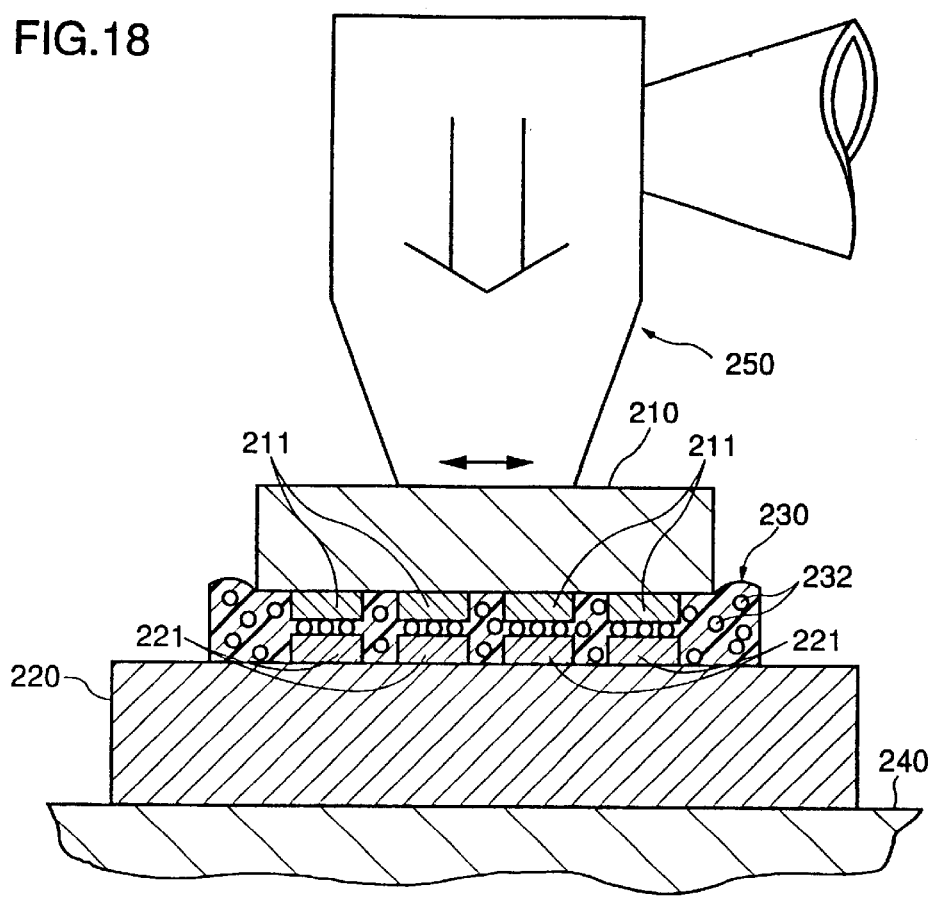
FIG. 18 is a typical sectional view of the semiconductor chip and the circuit board pressed against each other with ultrasonic vibration supplied therebetween.

Then, the semiconductor chip 210 is pressed against the circuit board 220 with an ultrasonic horn 250, as shown in FIG. 18. The semiconductor chip 210 is not only thermocompression-bonded to the board 220 but also supplied with ultrasonic vibration.

Figure 19:
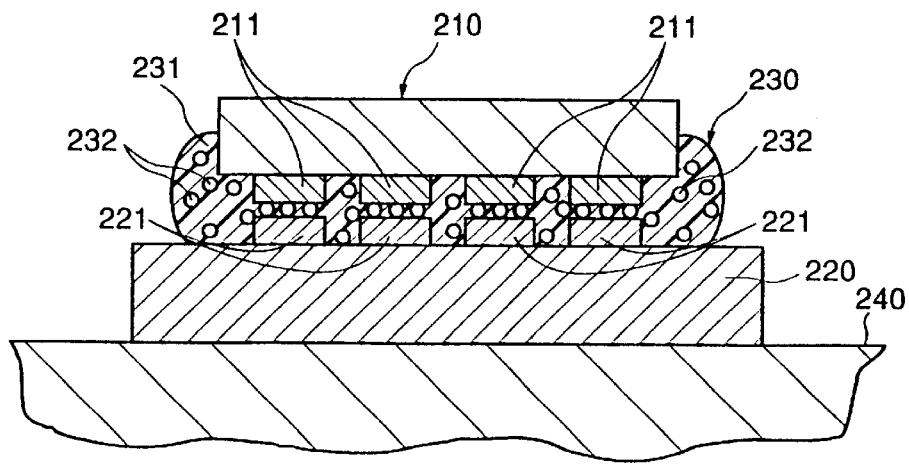
FIG. 19 is a sectional view showing the semiconductor chip mounted on the circuit board.

Referring to FIG. 19, the semiconductor chip 210 and the circuit board 220 are pressed to approach to each other while ultrasonic vibration is supplied therebetween with prescribed energy, whereby the conductive grains 232 are reliably brought into conductive contact with the electrode pads 211 and the conductor pads 221 by vibrational friction. Regions of the anisotropic conductive film 230 not held between the electrode pads 211 and the conductor pads 221 are not or only slightly crushed, whereby the conductive grains 232 contained in these regions are still dispersed along the thickness of the resin film 231. Thus, the semiconductor chip 210 and the circuit board 220 are kept insulated from each other in the regions provided with no pads 211 and 221.

As shown in FIG. 19, the anisotropic conductive film 230 is pressed along its thickness under heat, whereby the softened resin film 231 of the anisotropic conductive film 230 extends along the side surface of the semiconductor chip 210. When the resin film 231 is hardened and the semiconductor chip 210 is mounted on the circuit board 220, the electronic circuit of the semiconductor chip 210 is blocked and protected against the exterior by the resin film 231. According to this mount method, therefore, it is possible to protect the semiconductor chip 210, particularly the electronic circuit formed on this semiconductor chip 210, without packaging the semiconductor chip 210 obtained from a wafer with resin. Thus, the number of steps from fabrication of the semiconductor chip 210 up to mounting on the circuit board 220 or the like can be reduced, and the workability is remarkably improved.

Figure 20:
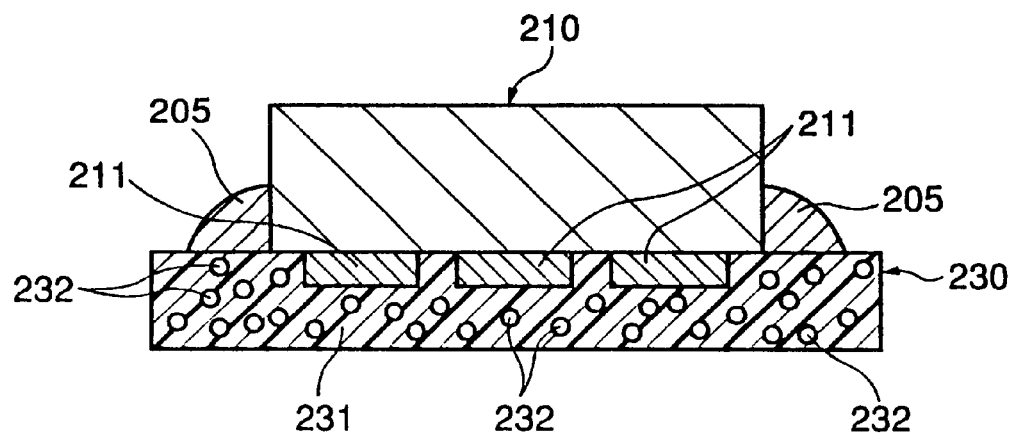
FIG. 20 is a typical sectional view of the semiconductor chip provided with the anisotropic conductive film and a protective film.

FIG. 20 shows a semiconductor chip structure according to a further embodiment of the present invention. The outer peripheral edge of an anisotropic conductive film 230 stuck on a major surface of a semiconductor chip 210 protrudes outward beyond that of the semiconductor chip 210. According to this embodiment, a protective film 205 is formed on a corner part between the side surface of the semiconductor chip 210 and the rear surface of the protruding part of the anisotropic conductive film 230. This protective film 205 can be formed by applying silicon resin, for example. According to this embodiment, an electronic circuit formed on the semiconductor chip 210 can be reliably protected due to the presence of the protective film 205.

Figure 21:
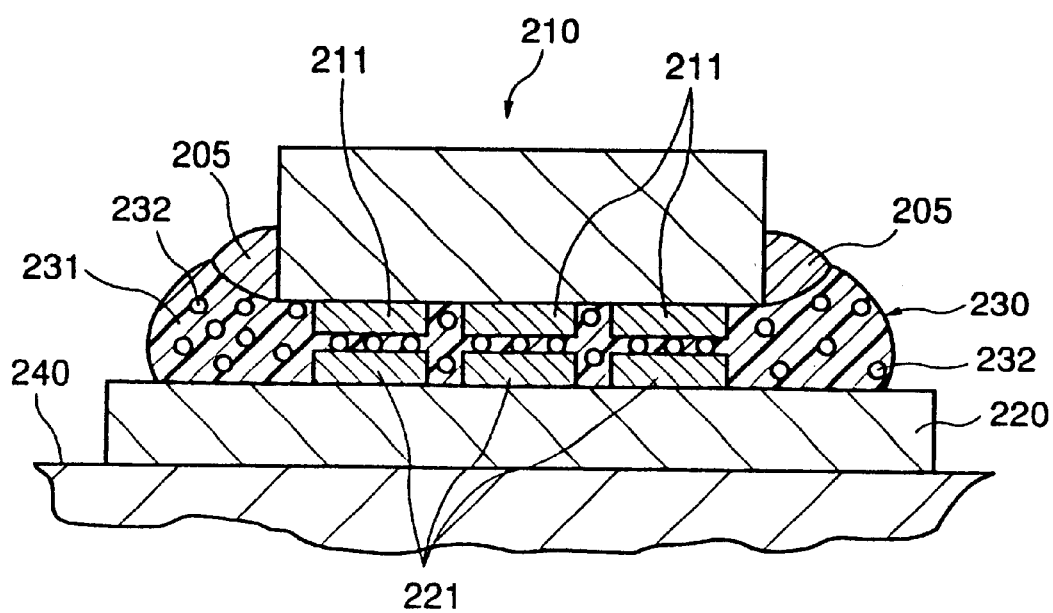
FIG. 21 is a sectional view of the semiconductor chip shown in FIG. 20 mounted on the circuit board.

When the semiconductor chip 210 is mounted on a circuit board 220, a resin film 231 of the anisotropic conductive film 230 extends around the protective film 205 and is solidified, as shown in FIG. 21. In such a mounted state, therefore, the electronic circuit formed on the semiconductor chip 210 can be further reliably protected by the resin film 231 which extends around the protective film 205 and is solidified, in addition to the action of the protective film 205. According to this mount method, a step of packaging the semiconductor chip 210 obtained from a wafer with resin can be omitted and the number of steps from fabrication of the semiconductor chip 210 up to mounting on the circuit board 220 or the like can be reduced, whereby the workability is remarkably improved.

The aforementioned mount method and structure are not restricted to the case of mounting the semiconductor chip 210 on the circuit board 220, but also applicable to the case of bonding the semiconductor chip 210 on a lead frame. In this case, internal lead terminals formed on the lead frame serve similarly as conductor pads 221 of the circuit board 220. Preferably, surfaces of the internal lead terminals are plated with gold. The electrode pads 211 of the semiconductor chip 210 and the internal lead terminals of the lead frame connected with each other electrically conduct to each other and are reliably connected with each other, similarly to the aforementioned embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of connecting terminals, comprising steps of:
    arranging a first terminal formed on a surface of a first member and a second terminal formed on a surface of a second member to be opposed to each other;
    interposing a film between opposed said first and second members; and
    electrically connecting said first and second terminals with each other by supplying ultrasonic vibration between said first and second terminals while applying pressure with no heating so that said first and second members approach each other.

2. The method of connecting terminals in accordance with claim 1, wherein
    said film is an anisotropic conductive film obtained by dispersing conductive grains in an adhesive resin film.

3. The method of connecting terminals in accordance with claim 1, wherein
    said film is a thermo-adhesive resin film.

4. The method of connecting terminals in accordance with claim 1, wherein
    said first member is a semiconductor chip, and
    said second member is a circuit board or a lead frame.

5. The method of connecting terminals in accordance with claim 1, further comprising the step of covering side surfaces of said first member with said film.

6. A method of fabricating a semiconductor chip, comprising steps of:
    forming a plurality of circuit elements on a major surface of a semiconductor wafer;
    forming bumps on electrode pads of respective said circuit elements;
    forming an anisotropic conductive film covering overall said major surface of said semiconductor wafer; and
    obtaining a semiconductor chip having an anisotropic conductive film on its surface by splitting said semiconductor wafer into each said circuit element.

7. The method of fabricating a semiconductor chip in accordance with claim 6, wherein
    said step of obtaining said semiconductor chip includes steps of:
    bonding said semiconductor wafer on an expandable tape,
    forming slits on said anisotropic conductive film and said semiconductor wafer along boundary lines between said plurality of circuit elements, and
    splitting said semiconductor wafer into a plurality of semiconductor chips along said slits by expanding said expandable tape.

8. The method fabricating a semiconductor chip according to claim 6, further comprising the step of having said anisotropic conductive film cover side surfaces of said semiconductive wafer.

\* \* \* \* \*